(12) United States Patent
Nikitin et al.

(10) Patent No.: US 9,040,346 B2
(45) Date of Patent: May 26, 2015

(54) SEMICONDUCTOR PACKAGE AND METHODS OF FORMATION THEREOF

(75) Inventors: Ivan Nikitin, Regensburg (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/463,636

(22) Filed: May 3, 2012

(65) Prior Publication Data

US 2013/0292684 A1 Nov. 7, 2013

(51) Int. Cl.
*H01L 23/48* (2006.01)
*H01L 21/56* (2006.01)
(Continued)

(52) U.S. Cl.
CPC .............. *H01L 24/03* (2013.01); *H01L 21/304* (2013.01); *H01L 21/568* (2013.01); *H01L 23/295* (2013.01); *H01L 23/34* (2013.01); *H01L 23/482* (2013.01); *H01L 23/488* (2013.01); *H01L 23/50* (2013.01); *H01L 24/06* (2013.01); *H01L 24/96* (2013.01); *H01L 25/07* (2013.01); *H01L 27/092* (2013.01); *H01L 29/78* (2013.01); *H01L 2224/03002* (2013.01); *H01L 2224/0401* (2013.01); *H01L 2224/04105* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/05666* (2013.01); *H01L 2224/05676* (2013.01); *H01L 2224/05681* (2013.01); *H01L 2224/05684* (2013.01); *H01L 2224/06181* (2013.01); *H01L 2224/131* (2013.01); *H01L 2224/16225* (2013.01);

(Continued)

(58) Field of Classification Search
CPC ........................ H01L 2224/97; H01L 21/304
USPC ......... 438/113, 127, 107, 675, 678, 685–688, 438/597; 257/E23.01, E23.011, 774, 257/E21.41, E21.499
See application file for complete search history.

(56) References Cited

U.S. PATENT DOCUMENTS 7,767,495 B2 * 8/2010 Fuergut et al. ................ 438/110
8,008,121 B2 8/2011 Choi et al.
(Continued)

OTHER PUBLICATIONS

Becker, K.-F., et al., "A New Wafer Level Packaging Approach: Encapsulation, Metallization and Laser Structuring for Advanced System in Package Manufacturing," Journal of Electronic Packaging, Mar. 2005, vol. 127, 6 pages.

(Continued)

*Primary Examiner* — Su C Kim
*Assistant Examiner* — Regan J Rundio
(74) *Attorney, Agent, or Firm* — Slater & Matsil, L.L.P.

(57) ABSTRACT

In one embodiment, a semiconductor package includes a semiconductor chip having a first contact region on a first major surface and a second contact region on an opposite second major surface. The semiconductor chip is configured to regulate flow of a current from the first contact region to the second contact region. An encapsulant is disposed at the semiconductor chip. A first contact plug is disposed within the encapsulant and coupled to the first contact region. A second side conductive layer is disposed under the second major surface and coupled to the second contact region. A through via is disposed within the encapsulant and coupled to the second side conductive layer. The first contact plug and the through via form terminals above the first major surface for contacting the semiconductor package.

20 Claims, 11 Drawing Sheets

(51) Int. Cl.
*H01L 21/768* (2006.01)
*H01L 29/732* (2006.01)
*H01L 21/304* (2006.01)
*H01L 23/34* (2006.01)
*H01L 23/482* (2006.01)
*H01L 23/488* (2006.01)
*H01L 23/50* (2006.01)
*H01L 23/00* (2006.01)
*H01L 25/07* (2006.01)
*H01L 27/092* (2006.01)
*H01L 29/78* (2006.01)
*H01L 23/29* (2006.01)

(52) U.S. Cl.
CPC . *H01L2224/73253* (2013.01); *H01L 2924/014* (2013.01); *H01L 2924/10253* (2013.01); *H01L 2924/10272* (2013.01); *H01L 2924/1033* (2013.01); *H01L 2924/12031* (2013.01); *H01L 2924/12032* (2013.01); *H01L 2924/1301* (2013.01); *H01L 2924/1305* (2013.01); *H01L 2924/13055* (2013.01); *H01L 2924/13062* (2013.01)

(56) References Cited

U.S. PATENT DOCUMENTS

| | | | |
|---|---|---|---|
| 2002/0195662 A1* | 12/2002 | Eden et al. | 257/349 |
| 2007/0246838 A1* | 10/2007 | Hoeglauer et al. | 257/781 |
| 2008/0006900 A1* | 1/2008 | Chan et al. | 257/499 |
| 2009/0072379 A1* | 3/2009 | Ewe et al. | 257/700 |
| 2009/0078943 A1* | 3/2009 | Ishida et al. | 257/77 |
| 2009/0261468 A1* | 10/2009 | Kroeninger et al. | 257/690 |
| 2010/0001414 A1* | 1/2010 | Mahler et al. | 257/784 |
| 2010/0044885 A1* | 2/2010 | Fuergut et al. | 257/784 |
| 2010/0051963 A1* | 3/2010 | Otremba | 257/77 |
| 2010/0078776 A1 | 4/2010 | Barth et al. | |
| 2010/0078778 A1 | 4/2010 | Barth et al. | |
| 2010/0133704 A1 | 6/2010 | Marimuthu et al. | |
| 2010/0157568 A1* | 6/2010 | Ewe et al. | 361/820 |
| 2010/0308443 A1 | 12/2010 | Suthiwongsunthorn et al. | |
| 2011/0024888 A1 | 2/2011 | Pagaila et al. | |
| 2011/0024918 A1* | 2/2011 | Brunnbauer et al. | 257/777 |
| 2011/0068444 A1 | 3/2011 | Chi et al. | |
| 2011/0095403 A1 | 4/2011 | Lee et al. | |
| 2011/0204505 A1 | 8/2011 | Pagaila et al. | |
| 2011/0215458 A1 | 9/2011 | Camacho et al. | |
| 2012/0013004 A1 | 1/2012 | Suthiwongsunthorn et al. | |
| 2012/0112278 A1* | 5/2012 | Loechelt et al. | 257/337 |
| 2013/0049214 A1* | 2/2013 | Nikitin et al. | 257/774 |
| 2013/0168870 A1* | 7/2013 | Fuergut et al. | 257/774 |

OTHER PUBLICATIONS

Uesugi, T., et al., "Which are the Future GaN Power Devices for Automotive Applications, Lateral Structures or Vertical Structures?," CS Mantech Conference, May 16-19, 2011, 4 pages.

Wojnowski, M., et al., "Package Trends for Today's and Future mm-Wave Applications," The 38th European Microwave Conference, 2008, 55 pages.

* cited by examiner

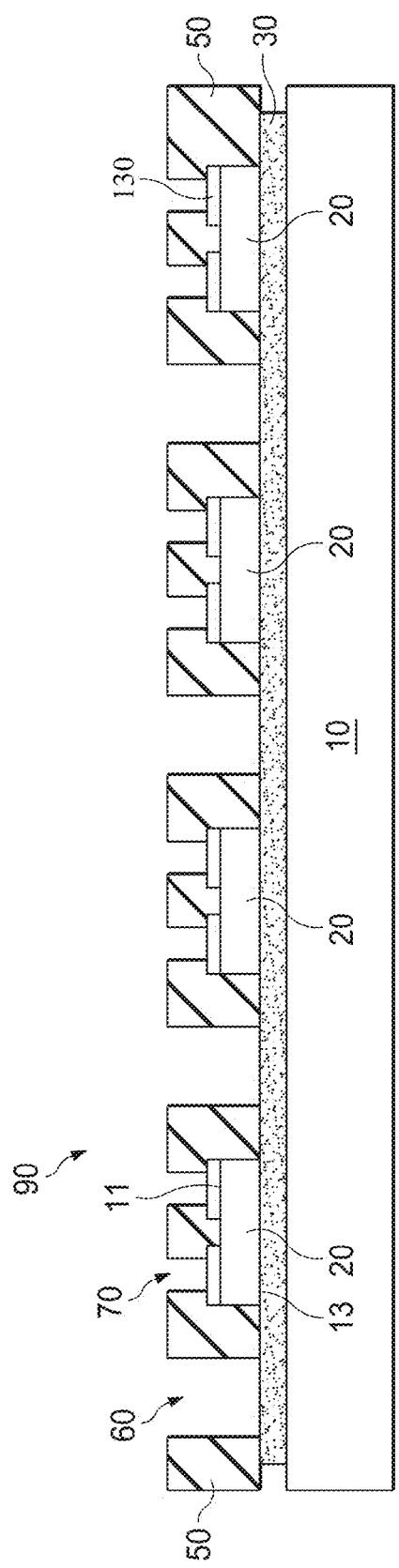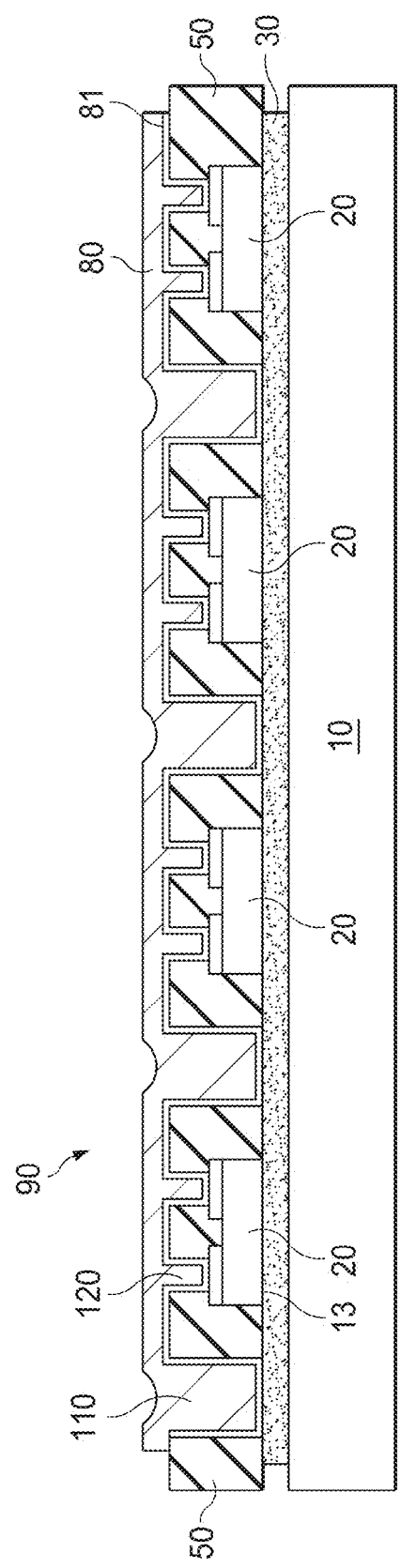

SEMICONDUCTOR PACKAGE AND METHODS OF FORMATION THEREOF

TECHNICAL FIELD

The present invention relates generally to semiconductor packages, and more particularly to semiconductor package and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect from physical damage and corrosion. The packaging also supports the electrical contacts required to connect to the devices. Many different types of packaging are available depending on the type and the intended use of the die being packaged. Typical packaging, e.g., dimensions of the package, pin count, may comply with open standards such as from Joint Electron Devices Engineering Council (JEDEC). Packaging may also be referred as semiconductor device assembly or simply assembly.

Packaging may be a cost intensive process because of the complexity of connecting multiple electrical connections to external pads while protecting these electrical connections and the underlying chips.

SUMMARY OF THE INVENTION

These and other problems are generally solved or circumvented, and technical advantages are generally achieved, by illustrative embodiments of the present invention.

In accordance with an embodiment of the present invention, a method of forming a semiconductor package comprises placing a plurality of semiconductor chips over a carrier. Each of the plurality of semiconductor chips has a first side contact region on a first side and an opposite second side. Each of the plurality of semiconductor chips has an active region adjacent the first side. The second side faces the carrier. The method further includes forming a reconstituted wafer by applying an encapsulant at the plurality of semiconductor chips and the carrier. A through opening and a contact opening are formed in the encapsulant. A first contact pad and a second contact pad are formed by filling the through opening and the contact opening with a conductive fill material. Individual packages are formed by singulating the reconstituted wafer. The plurality of semiconductor chips may include chips that are configured to regulate current flow in a direction from the first side towards the second side.

In accordance with an embodiment of the present invention, a semiconductor package includes a semiconductor chip having a first contact region on a first major surface and a second contact region on an opposite second major surface. The semiconductor chip is configured to regulate flow of a current from the first contact region to the second contact region. An encapsulant is disposed at the semiconductor chip. A first contact plug is disposed within the encapsulant and coupled to the first contact region. A second side conductive layer is disposed under the second major surface and coupled to the second contact region. A through via is disposed within the encapsulant and coupled to the second side conductive layer. The first contact plug and the through via form terminals above the first major surface for contacting the semiconductor package.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes FIGS. 2A-2D, illustrates a package comprising a three terminal semiconductor device in accordance embodiments of the invention, wherein FIGS. 2A and 2C-2D illustrate cross-sectional views and FIG. 2B illustrates a top view;

FIG. 5 illustrates the semiconductor package during fabrication after forming openings for contacts pads in accordance with an embodiment of the invention;

FIG. 6 illustrates the semiconductor package during fabrication after forming contact pads by filling the contact pad openings in accordance with an embodiment of the invention;

FIG. 8, which includes FIGS. 8A and 8B, illustrates the semiconductor package during fabrication after thinning the reconstituted wafer, wherein FIG. 8B illustrates a magnified cross-sectional of FIG. 8A in accordance with embodiments of the invention;

FIG. 17, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Power semiconductor dies have special requirements (e.g., due to the high voltages and high heat generation) and require good thermal management. Consequently, packages for power semiconductor devices have additional performance requirements while being very sensitive to production costs. Because of the smaller number of pin count (input/output leads), power dies are typically packaged as transistor outline (TO) packages although embodiments of the invention are not limited to a particular package type.

A structural embodiment of a semiconductor package having vertical semiconductor chips will be described using FIG. 1. An alternate structural embodiment will be described using FIG. 2. A method of forming a semiconductor package in accordance with various embodiments of the invention will be described using FIGS. 3-13. Alternative methods of forming a semiconductor package will be described using FIGS. 14-16. An embodiment of the invention for mounting the packages on a circuit board will be described using FIG. 17.

Figure 1:
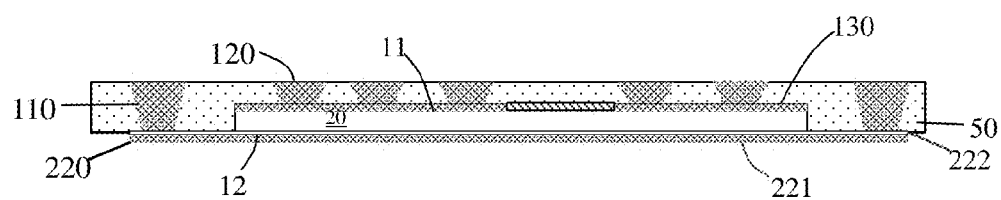
FIG. 1 illustrates a chip scale package comprising a power semiconductor in accordance to an embodiment of the invention.

FIG. 1 illustrates a chip scale package comprising a power semiconductor in accordance to an embodiment of the invention.

Referring to FIG. 1, a semiconductor chip 20 is disposed within an encapsulant 50. In one or more embodiments, the semiconductor chip 20 is a vertical semiconductor device due to the vertical flow of current, e.g., from a top surface 11 to a bottom surface 12. Accordingly, the semiconductor chip 20 has contact regions not only on the top surface 11 but also on the bottom surface 12. In some embodiments, the semiconductor chip 20 is a horizontal semiconductor device having a lateral flow of current.

In various embodiments, the semiconductor chip 20 may be formed on a silicon substrate. Alternatively, the semiconductor chip 20 may be a device formed on SiC. In one embodiment, the semiconductor chip 20 is a device formed at least partially on GaN.

In various embodiments, the semiconductor chip 20 comprises a power semiconductor device, which may be a discrete device in one embodiment. In one embodiment, the semiconductor chip 20 is a two terminal device such as a PIN diode or a Schottky diode. In one or more embodiments, the semiconductor chip 20 is a three terminal device such as a power metal insulator semiconductor field effect transistor (MISFET), a junction field effect transistor (JFET), bipolar junction transistor (BJT), an insulated gate bipolar transistor (IGBT), or a thyristor. In various embodiments, the semiconductor chip 20 is configured to operate at about 1 V to about 1000 V. In one embodiment, the semiconductor chip 20 is configured to operate at about 1 V to about 20 V. In one or more embodiments, the semiconductor chip 20 is configured to operate at about 20 V to about 1000 V. In one embodiment, the semiconductor chip 20 is configured to operate at about 20 V to about 100 V. In one embodiment, the semiconductor chip 20 is configured to operate at about 100 V to about 500 V. In one embodiment, the semiconductor chip 20 is configured to operate at about 500 V to about 1000 V.

In one embodiment, the semiconductor chip 20 is NPN transistor. In one embodiment, the semiconductor chip 20 is PNP transistor. In one embodiment, the semiconductor chip 20 is an n-channel MISFET. In another embodiment, the semiconductor chip 20 is a p-channel MISFET. In one or more embodiments, the semiconductor chip 20 may comprise a plurality of devices such as a vertical MISFET and a diode, or alternatively two MISFET devices separated by an isolation region.

The thickness of the semiconductor chip 20 from the top surface 11 to the bottom surface 12 may be less than 50 µm in various embodiments. The thickness of the semiconductor chip 20 from the top surface 11 to the bottom surface 12 may be less than 20 µm in various embodiments. The thickness of the semiconductor chip 20 from the top surface 11 to the bottom surface 12 may be less than 10 µm in various embodiments.

In various embodiments, the thickness of the semiconductor chip 20 from the top surface 11 to the bottom surface 12 may be about 1 µm to about 1000 µm in various embodiments. The thickness of the semiconductor chip 20 from the top surface 11 to the bottom surface 12 may be about 5 µm to about 50 µm in various embodiments. The thickness of the semiconductor chip 20 from the top surface 11 to the bottom surface 12 may be about 5 µm to about 20 µm in one embodiment.

The thickness of the semiconductor chip 20 from the top surface 11 to the bottom surface 12 may be about 10 µm to about 20 µm in one embodiment. A thickness less than 25 µm may be advantageous to minimize electrical resistivity and to improve thermal conductivity so as to facilitate improved electrical performance while efficiently removing heat generated within the semiconductor chip 20 during operation. However, a thickness less than 5 µm may introduce stability issues during fabrication and/or operation.

In various embodiments, the encapsulant 50 comprises a dielectric material and may comprise a mold compound in one embodiment. In other embodiments, the encapsulant 50 may comprise a polymer, a biopolymer, a fiber impregnated polymer (e.g., carbon or glass fibers in a resin), a particle filled polymer, and other organic materials. In one or more embodiments, the encapsulant 50 comprises a sealant not formed using a mold compound, and materials such as epoxy resins and/or silicones. In various embodiments, the encapsulant 50 may be made of any appropriate duroplastic, thermoplastic, or thermosetting material, or a laminate. The material of the encapsulant 50 may include filler materials in some embodiments. In one embodiment, the encapsulant 50 may comprise epoxy material and a fill material comprising small particles of glass or other electrically insulating mineral filler materials like alumina or organic fill materials.

Contact plugs 120 are disposed over the top surface 11 of the semiconductor chip 20. The contact plugs 120 form contact pads, which, for example, may be mounted on to a circuit board. The contact plugs 120 provide connection to external input and output signals and other signals as needed for the functioning of the semiconductor chip 20. The contact plugs 120 may comprise copper in one embodiment. In an alternative embodiment, the contact plugs 120 comprise aluminum. In other embodiments, the contact plugs 120 may comprise tungsten, titanium, tantalum, ruthenium, nickel, cobalt, platinum, gold, silver, and such other materials.

The top surface 11 of the semiconductor chip 20 may include front side metallization layers 130, which may comprise one or more levels of metal lines and vias in various embodiments. The metallization layer 130 may couple various devices within the semiconductor chip 20 in one embodiment. In another embodiment, the metallization layer 130 forms contacts to different regions of a discrete semiconductor device.

In one or more embodiments, through-substrate vias 110 are disposed within the encapsulant 50. The through substrate vias 110 are conductive so as to form a contact pad for the back side of the semiconductor chip 20. In one or more embodiments, the through substrate vias 110 comprise a conductive fill material such as copper, aluminum, and such others. In other embodiments, the fill material may comprise tungsten, titanium, tantalum, ruthenium, nickel, cobalt, platinum, gold, silver, and such other materials. The through substrate vias 110 may comprise an outer barrier layer, which may comprise a conductive material such as a metal nitride in some embodiments. The sidewalls of the through substrate vias 110 may also include an outer most layer comprising a dielectric material in some embodiments.

A back side metallization layer 220 is disposed on the back side of the semiconductor chip 20. The back side metallization layer 220 may comprise a back plate 221 in one embodiment. In one embodiment, the back side metallization layer 220 is formed as a blanket layer, i.e., unstructured layer, under the semiconductor chip 20. The back side metallization layer 220 may comprise a diffusion barrier layer 222 contacting the semiconductor chip 20. The diffusion barrier layer 222 may prevent atoms of the back side metallization layer 220 from diffusing into the semiconductor chip 20. The diffusion barrier layer 222 may comprise titanium nitride, and/or tantalum nitride in one or more embodiments. In one embodiment, the diffusion barrier layer 222 may comprise Ta, TaN, TiW, Ti, TiN, Ru, W, WN, WCN, or a combination thereof. In some embodiments, the back side metallization layer 220 may also comprise a seed layer disposed over the diffusion barrier layer 222. The back plate 221 of the back side metallization layer 220 comprises copper, although in other embodiments, other conductive materials such as doped polysilicon, tungsten, aluminum, silver, gold, nickel, palladium, or combination thereof may be used.

Figure 2A:
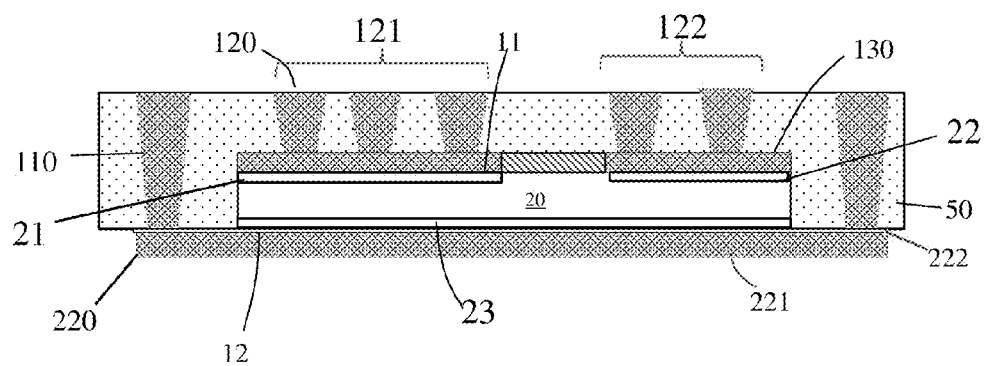
Figure 2B:
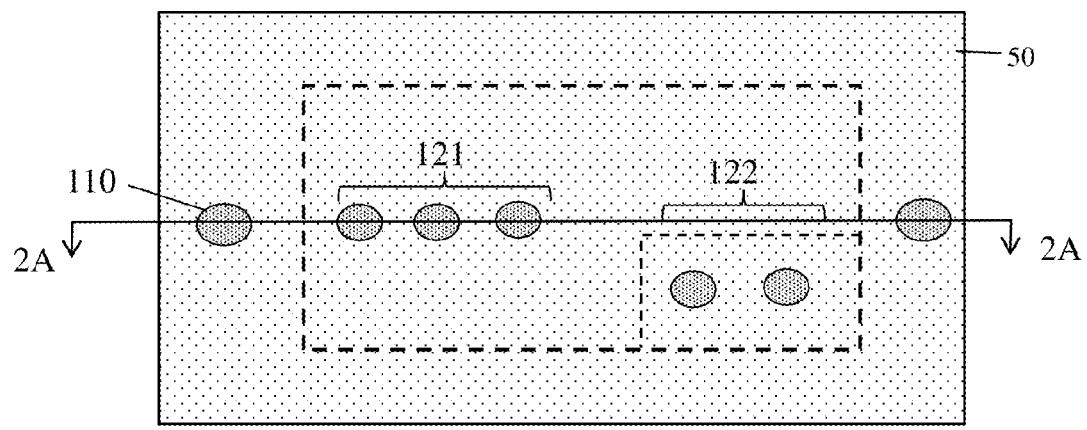
Figure 2C:
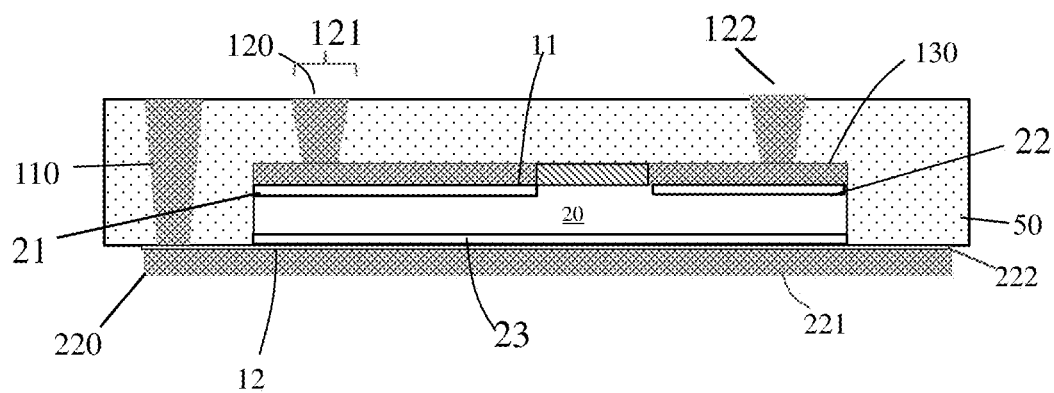
Figure 2D:
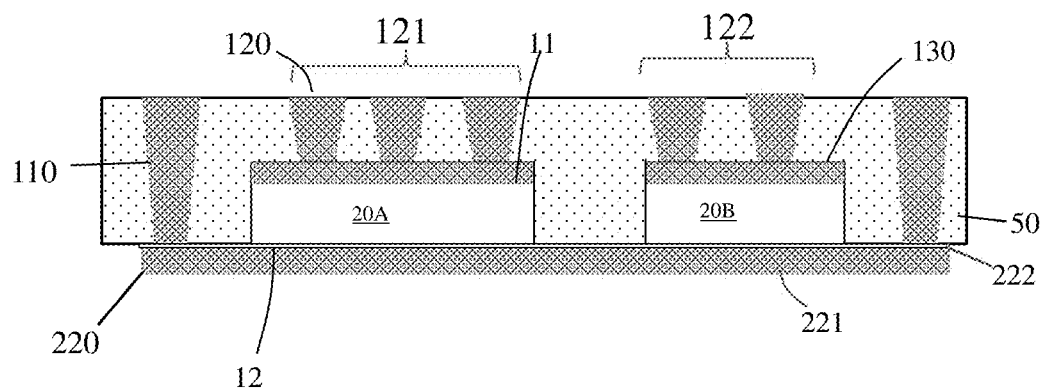

FIG. 2, which includes FIGS. 2A-2D, illustrates a package comprising a three terminal semiconductor device in accordance with an embodiment of the invention, wherein FIG. 2A illustrates a cross-sectional view and FIG. 2B illustrates a top view, wherein FIGS. 2C and 2D illustrate alternative cross-sectional views.

Referring to FIG. 2A, in one or more embodiments, the package comprises a semiconductor chip 20 as described in the prior embodiment. Further, the semiconductor chip 20 is a discrete three terminal power semiconductor device. In one embodiment, the semiconductor chip 20 is a three terminal transistor having a source, a gate, and a drain. In one embodiment, the source and gate are formed adjacent the top surface 11 while the drain is formed adjacent the bottom surface 12. Consequently, the top surface 11 has a source contact region 21 and a gate contact region 22 while the back surface 13 has a drain contact region 23. The source contact region 21, the gate contact region 22, and the drain contact region 23 may comprise a silicide region in one embodiment.

In one embodiment, a first plurality of contacts 121 of the contact plugs 120 contact a same region of the semiconductor chip 20. For example, as illustrated in FIG. 2A, the first plurality of contacts 121 may be coupled directly or indirectly to the source contact region 21 of a discrete transistor forming the semiconductor chip 20. In one embodiment, a second plurality of contacts 122 of the contact plugs 120 contact the gate contact region 22. As illustrated in FIG. 2B, the first plurality of contacts 121 and the second plurality of contacts 122 form contact pads so as to couple the semiconductor chip 20 to external signals.

FIG. 2C illustrates an alternative embodiment showing a three-terminal package in which one of a first plurality of contacts 121, one of a second plurality of contacts 122, and the through substrate via 110 form terminals of the three-terminal package.

FIG. 2D illustrates an alternative embodiment of a semiconductor module having a plurality of packages. As illustrated in FIG. 2D, the package may comprise a first semiconductor chip 20A and a second semiconductor chip 20B. In one embodiment, the first semiconductor chip 20A may be a semiconductor chip 20 as described in the prior embodiment. The second semiconductor chip 20B may be a same type or different type of semiconductor chip. In one embodiment, the second semiconductor chip 20B may comprise a horizontal semiconductor chip having horizontal current flow. In various embodiments, more than one different type of semiconductor chip may be included. As an example, the semiconductor package may comprise two power semiconductor chips and at least one horizontal semiconductor chip in one embodiment.

FIGS. 3-13 illustrate a cross-sectional view of a semiconductor device during various stages of fabrication in accordance with an embodiment of the invention.

Figure 3:
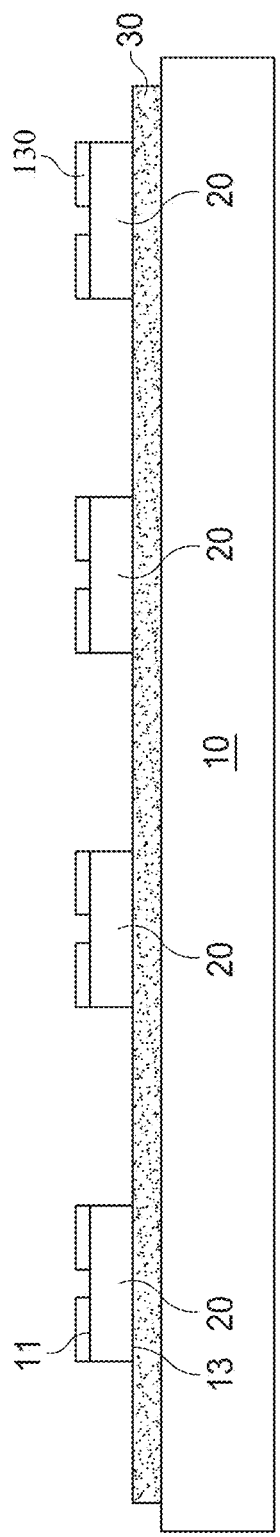
FIG. 3 illustrates a semiconductor package during fabrication after the placements of singulated dies over a carrier in accordance with an embodiment of the invention.

FIG. 3 illustrates a semiconductor package during fabrication after the placements of singulated dies over a carrier in accordance with an embodiment of the invention.

Referring to FIG. 3, a plurality of semiconductor chips 20 are placed over a carrier 10. The plurality of semiconductor chips 20 may comprise a same type of chips or may include different types of semiconductor chips (for example, as illustrated in FIG. 2D). The plurality of semiconductor chips 20 have active regions adjacent the top surface 11 relative to the back surface 13, which faces the carrier 10. The plurality of semiconductor chips 20 may be formed using conventional processing, for example, within a wafer, which is diced to form the plurality of semiconductor chips 20. As described above, the plurality of semiconductor chips 20 may be formed on a silicon substrate such as a bulk silicon substrate or a silicon on insulator substrate. Alternatively, the semiconductor chip 20 may be a device formed on SiC. Embodiments of the invention may also include devices formed on compound semiconductor substrates and may include devices on heteroepitaxial substrates. In one embodiment, the semiconductor chip 20 is a device formed at least partially on GaN, which may be a GaN on sapphire or silicon substrate.

Next, the plurality of semiconductor chips 20 is attached to the carrier 10, which provides mechanical support and stability during processing. In various embodiments, the carrier 10 may be a plate made of a rigid material, for example, a metal such as nickel, steel, or stainless steel, a laminate, a film, or a material stack. The carrier 10 may have at least one flat surface over which the plurality of semiconductor chips 20 may be placed. In one or more embodiments, the carrier 10 may be round or square-shaped although in various embodiments the carrier 10 may be any suitable shape. The carrier 10 may have any appropriate size in various embodiments. In some embodiments, the carrier 10 may include an adhesive tape, for example, a double sided sticky tape laminated onto the carrier 10. The carrier 10 may comprise a frame, which is an annular structure (ring shaped) with an adhesive foil in one embodiment. The adhesive foil may be supported along the outer edges by the frame in one or more embodiments.

The plurality of semiconductor chips 20 may be attached using an adhesive layer 30 in various embodiments. In various embodiments, the adhesive layer 30 may comprise glue or other adhesive type material. In various embodiments, the adhesive layer 30 may be thin, for example, less than about 100 µm and between 1 µm to about 50 µm in another embodiment.

In various embodiments, the plurality of semiconductor chips 20 may comprise power chips, which, for example, draw large currents (e.g., greater than 30 amperes). In various embodiments, the plurality of semiconductor chips 20 may comprise discrete vertical devices such as a two or a three terminal power device. Examples of the semiconductor chips 20 include PIN or Schottky diodes, MISFET, JFET, BJT, IGBT, or thyristor.

Figure 4:
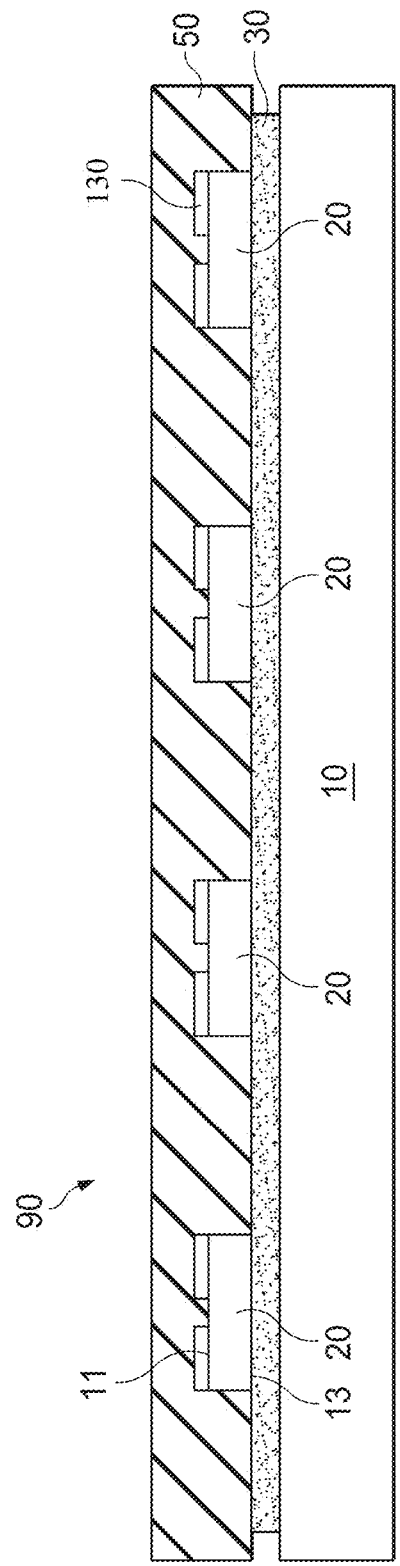
FIG. 4 illustrates the semiconductor package during fabrication after forming a reconstituted wafer in accordance with an embodiment of the invention.

FIG. 4 illustrates the semiconductor package during fabrication after forming a reconstituted wafer in accordance with an embodiment of the invention.

As illustrated in FIG. 4, an encapsulant 50 is applied over the plurality of semiconductor chips 20. In one embodiment, the encapsulant 50 is applied using a compression molding process. In compression molding, the encapsulant 50 may be placed into a molding cavity, then the molding cavity is closed to compress the encapsulant 50. Compression molding may be used when a single pattern is being molded. In an alternative embodiment, the encapsulant 50 is applied using a transfer molding process. In other embodiments, the encapsulant 50 may be applied using injection molding, granulate molding, powder molding, or liquid molding. Alternatively, the encapsulant 50 may be applied using printing processes such as stencil or screen printing.

In various embodiments, the encapsulant 50 comprises a dielectric material and may comprise a mold compound in one embodiment. In other embodiments, the encapsulant 50 may comprise a polymer, a biopolymer, a fiber impregnated polymer (e.g., carbon or glass fibers in a resin), a particle filled polymer, and other organic materials. In one or more embodiments, the encapsulant 50 comprises a sealant not formed using a mold compound, and materials such as epoxy resins and/or silicones. In various embodiments, the encapsulant 50 may be made of any appropriate duroplastic, thermoplastic, or thermosetting material, or a laminate. The material of the encapsulant 50 may include filler materials in some embodiments. In one embodiment, the encapsulant 50 may comprise epoxy material and a fill material comprising small particles of glass or other electrically insulating mineral filler materials like alumina or organic fill materials. The encapsulant 50 may be cured, i.e., subjected to a thermal process to harden thus forming a hermetic seal protecting the plurality of semiconductor chips 20. The curing process hardens the encapsulant 50 thereby forming a single substrate holding the plurality of semiconductor chips 20. Such a substrate is referred as a reconstituted wafer 90.

FIG. 5 illustrates the semiconductor package during fabrication after forming openings for contacts pads in accordance with an embodiment of the invention.

Referring to FIG. 5, a plurality of through via openings 60 are formed within the encapsulant 50. A plurality of contact openings 70 are also formed within the encapsulant 50. In one embodiment, the plurality of through via openings 60 and the plurality of contact openings 70 are formed using a laser process. For example, a laser drill may be used to structure the encapsulant 50. In one embodiment, a carbon dioxide laser may be used for the laser drilling. In another embodiment, the laser drilling may comprise a Nd:YAG laser. In an alternative embodiment, the plurality of through via openings 60 and the plurality of contact openings 70 are formed after a conventional lithography process, for example, using a plasma etching process.

In various embodiments, the plurality of through via openings 60 comprises a maximum diameter less than 500 µm. The plurality of through via openings 60 comprises a maximum diameter less than 400 µm in one or more embodiments. The plurality of through via openings 60 comprises a maximum diameter less than 300 µm in one embodiment. The plurality of through via openings 60 comprises a maximum diameter of about 200 µm to about 350 µm in various embodiments.

FIG. 6 illustrates the semiconductor package during fabrication after forming contact pads by filling the contact pad openings in accordance with an embodiment of the invention.

As next illustrated in FIG. 6, a metal liner 81 may be formed within the plurality of through via openings 60 and the plurality of contact openings 70. The metal liner 81 may comprise a diffusion barrier material and may also comprise a seed layer for subsequent electroplating. As an example, the metal liner 81 may comprise a stack of metal nitride (e.g., TiN, TaN) followed by a seed layer (e.g., Cu) in one embodiment. The metal liner 81 may be deposited, for example, using sputter deposition in one embodiment. In one embodiment, the metal liner 81 may be deposited using radio frequency (RF) magnetron sputtering. In alternative embodiments, the metal liner 81 may comprise a layer of Ta, TaN, W, WN, WCN, WSi, Ti, TiN and/or Ru as examples. The seed layer may be deposited conformally over the diffusion barrier material, for example, using a plasma vapor deposition (PVD) sputtering or a metal-organic chemical vapor deposition (MOCVD) process. In various embodiments, the seed layer comprises the same material as the material to be deposited using a electroplating or an electroless deposition process. The seed layer comprises copper in one embodiment.

A conductive fill material 80 is filled within the plurality of through via openings 60 and the plurality of contact openings 70. In various embodiments, the conductive fill material 80 is deposited using an electrochemical deposition process such as electroplating. Alternatively, the conductive fill material 80 may be deposited using an electroless deposition process.

Thus, after depositing the conductive fill material 80, through substrate vias 110 are formed within the plurality of through via openings 60 while contact plugs 120 are formed within the plurality of contact openings 70.

Figure 7:
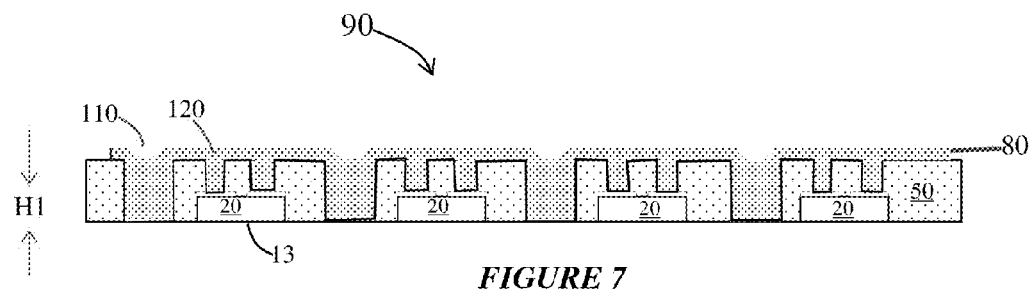
FIG. 7 illustrates the semiconductor package during fabrication after separating the reconstituted wafer from the carrier in accordance with an embodiment of the invention.

FIG. 7 illustrates the semiconductor package during fabrication after separating the reconstituted wafer from the carrier in accordance with an embodiment of the invention.

Referring to FIG. 7, the carrier 10 is removed to separate the reconstituted wafer 90 or artificial wafer. The encapsulant 50 embedded with the plurality of semiconductor chips 20 provides mechanical stability during subsequent processing. Removing the carrier 10 also exposes the back surface 13 of the semiconductor chip 20.

Figure 8A:
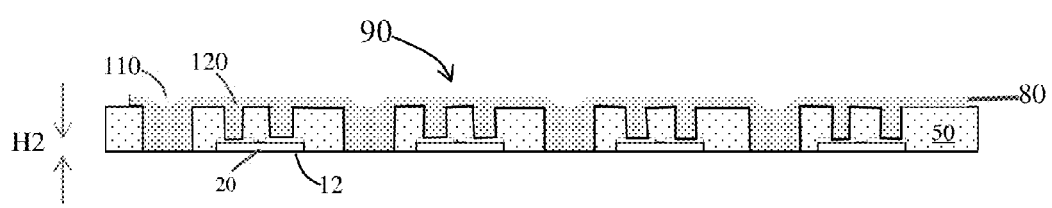
Figure 8B:
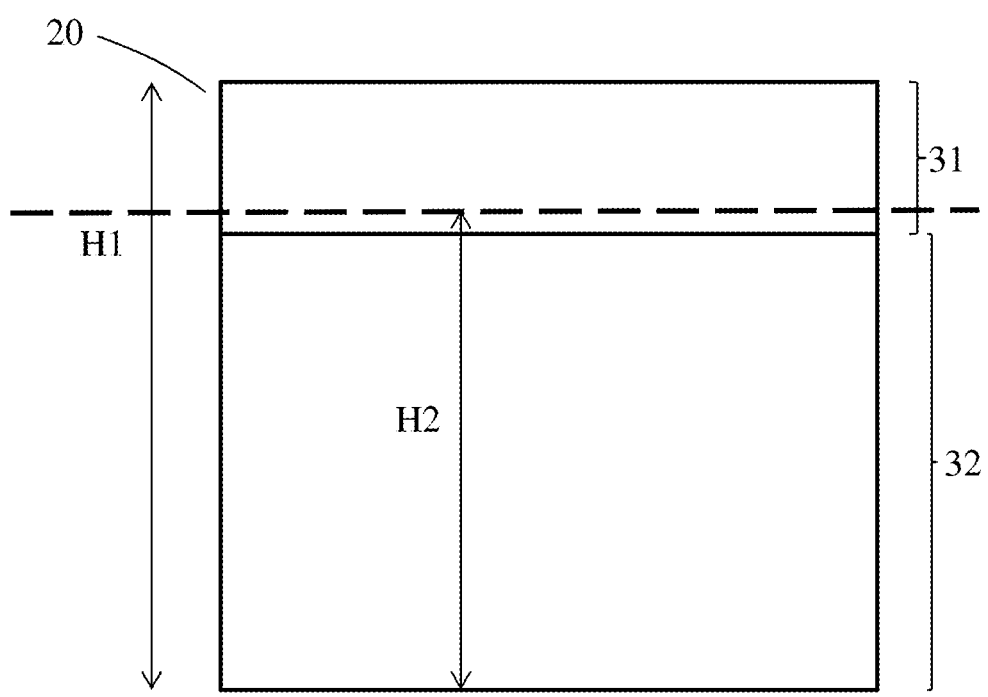

FIG. 8, which includes FIGS. 8A and 8B, illustrates the semiconductor package during fabrication after thinning the reconstituted wafer, wherein FIG. 8B illustrates a magnified cross-sectional of FIG. 8A in accordance with embodiments of the invention.

As next illustrated in FIG. 8A, the reconstituted wafer 90 is thinned decreasing the thickness of the plurality of semiconductor chips 20 from a first thickness H1 (FIG. 7) to a second thickness H2 (FIG. 8) thereby exposing a bottom surface 12. In various embodiments, the thinning may be performed using a mechanical process such as grinding. In some embodiments, a chemical process or a chemical mechanical process may be used for the thinning.

In various embodiments, the second thickness H2 after the thinning is about 20 µm to about 100 µm, and 80 µm to about 120 µm in one embodiment. In another embodiment, the second thickness H2 after the thinning is about 50 µm to about 100 µm. In another embodiment, the second thickness H2 after the thinning is about 20 µm to about 50 µm. In another embodiment, the second thickness H2 after the thinning is about 10 µm to about 20 µm. In another embodiment, the second thickness H2 after the thinning is at least 10 µm.

In another embodiment, the second thickness H2 after the thinning is at least 20 µm. In another embodiment, the second thickness H2 after the thinning is at least 50 µm. In another embodiment, the second thickness H2 after the thinning is less than 100 µm. In another embodiment, the second thickness H2 after the thinning is less than 80 µm. In another embodiment, the second thickness H2 after the thinning is less than 50 µm. In another embodiment, the second thickness H2 after the thinning is less than 30 µm. The second thickness H2 may be selected based on the mechanical stability, need for reducing resistances, and others.

In some embodiments, as illustrated in FIG. 8B, the structure of the substrate comprising the plurality of the semiconductor chips 20 may be changed during the thinning process. FIG. 8B illustrates the thickness of a semiconductor chip 20 before and after thinning. The semiconductor chip 20 prior to thinning comprises a first layer 31 comprising the active region and a second layer 32 comprising a different material than the first layer 31. In one embodiment, the first layer 31 comprises silicon and the second layer 32 comprises an oxide layer when the semiconductor chip 20 is being fabricated on a silicon on insulator substrate. In another embodiment, the first layer 31 comprises a compound semiconductor material such as GaN and the second layer 32 comprises silicon when the semiconductor chip 20 is being fabricated on a GaN/Si heteroepitaxial substrate. The thickness of the semiconductor chip 20 prior to thinning is the first thickness H1 while after the thinning is the second thickness H2.

For example, when the plurality of the semiconductor chips 20 is formed on a silicon on insulator substrate, the thinning process may be stopped after removing the insulator layer.

Similarly, in case of a hetero-epitaxial substrate, such as a GaN layer on a silicon substrate, the thinning process may be stopped after removing the silicon substrate leaving the GaN layer. Alternatively, a small portion of the silicon substrate may be left, which may be converted to a silicide subsequently. For example, this may be used to form vertical GaN power devices.

Figure 9:
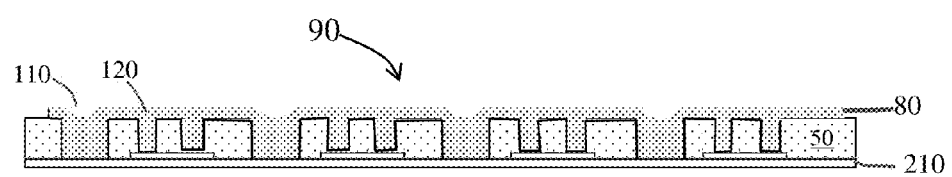
FIG. 9 illustrates the semiconductor package during fabrication after forming a back side metal liner under the reconstituted wafer in accordance with an embodiment of the invention.

FIG. 9 illustrates the semiconductor package during fabrication after forming a back side metal liner under the reconstituted wafer in accordance with an embodiment of the invention.

Referring next to FIG. 9, a back side metal liner 210 is formed under the exposed bottom surface 12 of the reconstituted wafer. The back side metal liner 210 may deposited as a blanket layer in one or more embodiments. In various embodiments, the back side metal liner 210 comprises the same material (i.e., a seed layer) as the material to be deposited using a electroplating or an electroless deposition process. The back side metal liner 210 comprises copper in one embodiment. In another embodiment, the back side metal liner 210 comprises platinum, gold, silver, and/or zinc.

The back side metal liner 210 may comprise a seed layer and an optional diffusion barrier material such that the seed layer is deposited conformally over the optional diffusion barrier material. In various embodiments, the back side metal liner 210 may be deposited using a plasma vapor deposition (PVD) sputtering or a metal-organic chemical vapor deposition (MOCVD) process. In alternative embodiments, the back side metal liner 210 may comprise a layer of Ta, TaN, W, WN, WCN, WSi, Ti, TiN and/or Ru as examples.

Figure 10:
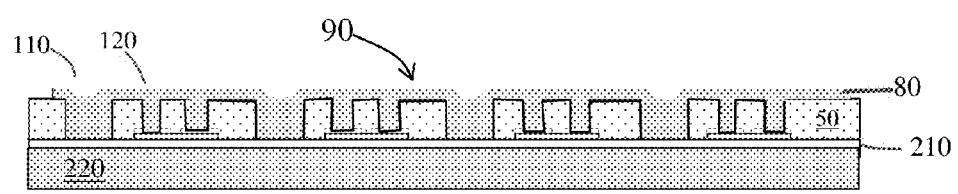
FIG. 10 illustrates the semiconductor package during fabrication after the formation of a back side metal layer under the metal liner and the reconstituted wafer in accordance with an embodiment of the invention.

FIG. 10 illustrates the semiconductor package during fabrication after the formation of a back side metal layer under the reconstituted wafer in accordance with an embodiment of the invention.

As illustrated in FIG. 10, a back side metal layer 220 is formed under the back side metal liner 210. In various embodiments, the back side metal layer 220 may be deposited using an electrochemical deposition process such as electroplating. In another embodiment, an electroless deposition may be used. In yet another embodiment, a deposition process such as a sputtering or MOCVD may be used to form the back side metal layer 220. In alternative embodiments, the back side metal layer 220 may comprise a layer of Ta, TaN, W, WN, WCN, WSi, Ti, TiN and/or Ru as examples. In one case, a copper seed layer is deposited as the back side metal liner 210 followed by copper electroplating to form the back side metal layer 220. In another example, a titanium barrier layer is deposited as the back side metal liner 210 followed by aluminum deposition to form the back side metal layer 220.

Figure 11:
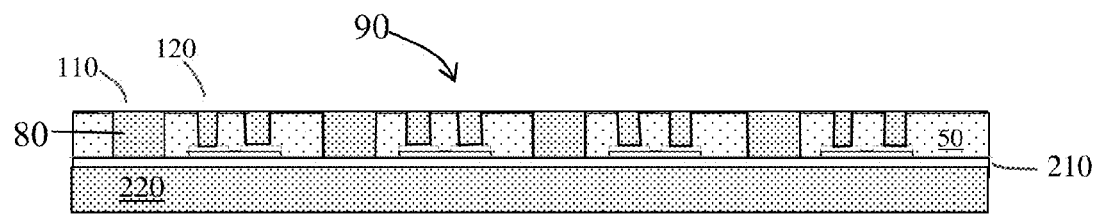
FIG. 11 illustrates the semiconductor package during fabrication after planarization of the front side of the reconstituted wafer in accordance with an embodiment of the invention.

FIG. 11 illustrates the semiconductor package during fabrication after planarization of the front side of the reconstituted wafer in accordance with an embodiment of the invention.

The prior electroplating processes may have shorted the front side contacts in some embodiments. Therefore, in some embodiments, a polishing such as a chemical, mechanical, or a chemical mechanical polishing may be performed from the front side of the reconstituted wafer. The polishing step may be performed in a different process step in other embodiments, for example, after the depositing the conductive fill material 80.

Figure 12:
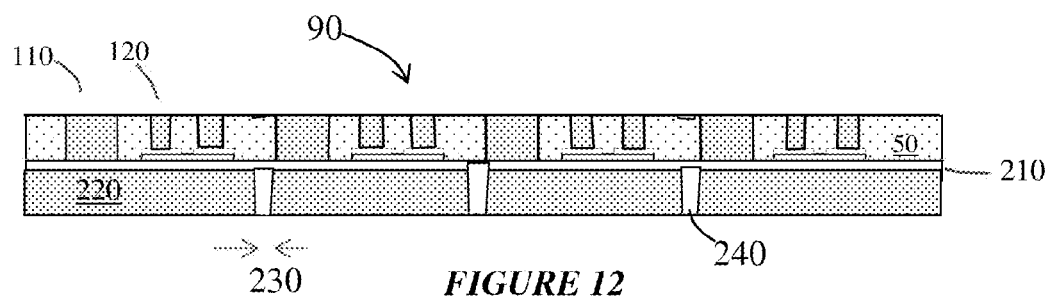
FIG. 12 illustrates the semiconductor package during fabrication after structuring the back side metal layer in accordance with an embodiment of the invention.

FIG. 12 illustrates the semiconductor package during fabrication after structuring the back side metal layer in accordance with an embodiment of the invention.

The back side metal layer 220, the back side metal liner 210, and optionally the conductive fill material 80 on the front side may be patterned so as to form dicing openings 240 disposed in a dicing region 230.

Figure 13:
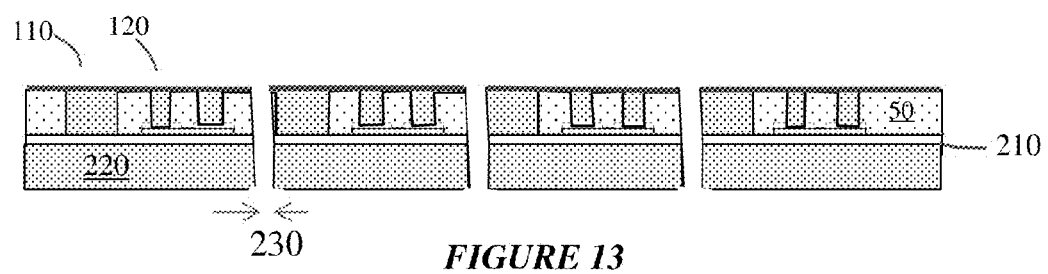
FIG. 13 illustrates the semiconductor package during fabrication after removing the exposed encapsulant in accordance with an embodiment of the invention.

FIG. 13 illustrates the semiconductor package during fabrication after removing the exposed encapsulant in accordance with an embodiment of the invention.

Next, the reconstituted wafer 90 is singulated to form individual packages. In various embodiments, the singulation may be performed chemically, for example, using a plasma process. In another embodiment, the singulation may be performed mechanically, e.g., using a dicing saw. In some embodiments, the singulation may be performed using a combination of chemical and mechanical processes.

Figure 14:
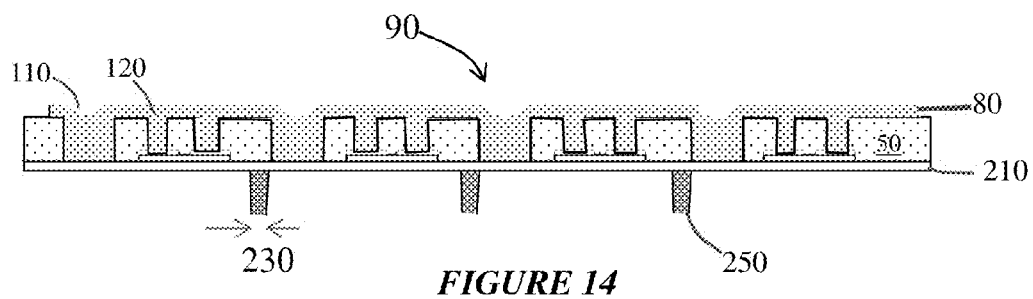
FIG. 14 illustrates the semiconductor package during fabrication after forming a plurality of resist structures in accordance with an embodiment of the invention.
Figure 15:
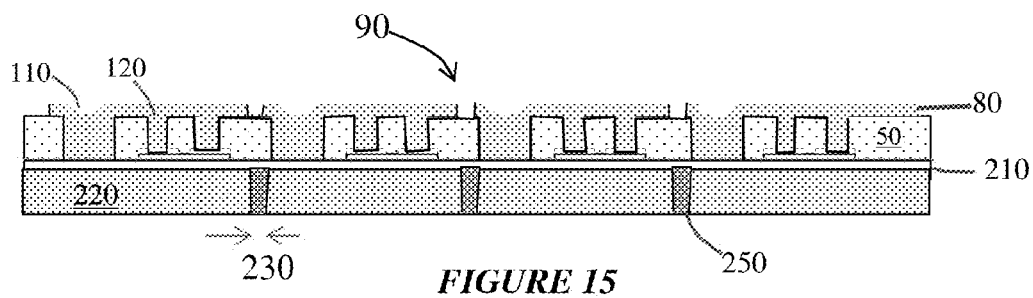
FIG. 15 illustrates the semiconductor package during fabrication after depositing a patterned back side metal layer in accordance with an embodiment of the invention.
Figure 16:
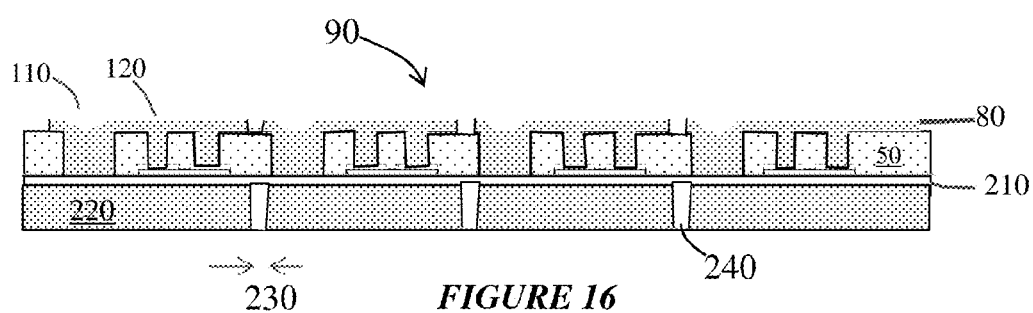
FIG. 16 illustrates the semiconductor package during fabrication after removing the plurality of resist structures in accordance with an embodiment of the invention.

FIGS. 14-16 illustrate an alternative embodiment of forming semiconductor packages having vertical semiconductor chips.

This embodiment follows the prior embodiment as described in FIGS. 3-9. Unlike the prior embodiment, the back side metal layer 220 is pattern deposited.

FIG. 14 illustrates the semiconductor package during fabrication after forming a plurality of resist structures in accordance with an embodiment of the invention.

As illustrated in FIG. 14, a plurality of resist structures 250 is formed over the dicing regions 230. The plurality of resist structures 250 may be formed by depositing a resist layer and patterning the resist layer using conventional lithography. Alternatively, the plurality of resist structures 250 may be formed using a laser ablation process in some embodiments. In other embodiments, the plurality of resist structures 250 may be formed using a printing process such as a stencil printing process.

FIG. 15 illustrates the semiconductor package during fabrication after depositing a patterned back side metal layer in accordance with an embodiment of the invention.

A conductive material is deposited to form a back side metal layer 220. In various embodiments, the conductive material is deposited using a electrochemical deposition process. Accordingly, the conductive material does not deposit over the plurality of resist structures 250.

FIG. 16 illustrates the semiconductor package during fabrication after removing the plurality of resist structures in accordance with an embodiment of the invention.

The plurality of resist structures 250 may be removed, for example, using a wet chemical etch process. Thus, dicing openings 240 are formed in the dicing regions 230. Subsequent processing may follow as described in FIG. 13.

Figure 17A:
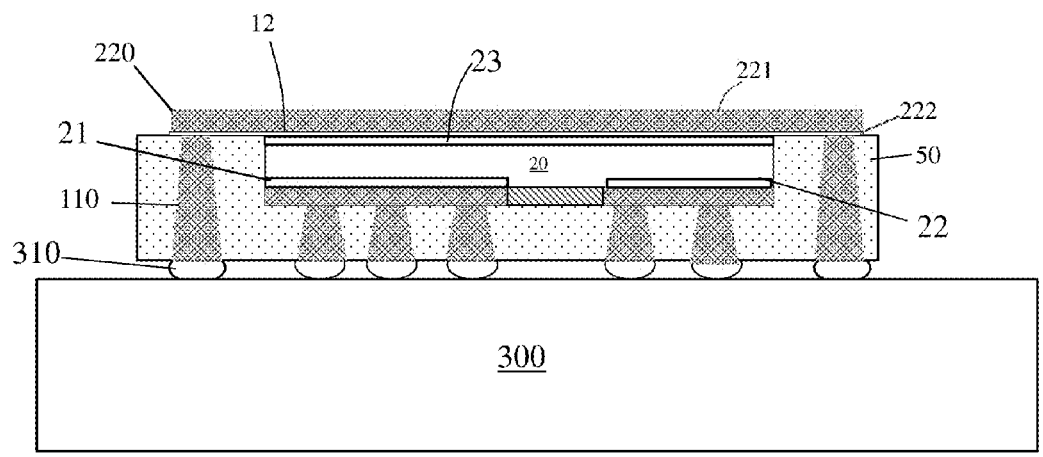
FIGS. 17A and 17B, illustrates semiconductor packages formed using embodiments of the invention and mounted over a circuit board.
Figure 17B:
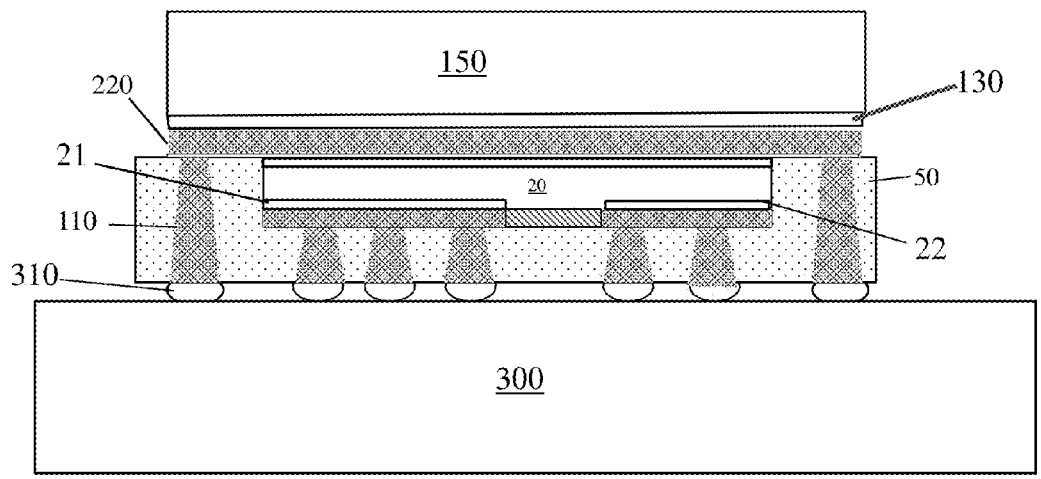

FIG. 17, which includes FIGS. 17A and 17B, illustrates semiconductor packages formed using embodiments of the invention and mounted over a circuit board.

The semiconductor packages formed using embodiments of the invention may be mounted over a printed circuit board 300 in one embodiment. In one embodiment, the semiconductor package may be arranged face-down on a main surface of the printed circuit board 300. For example, additional solder balls 310 may be formed under the through substrate vias 110 and the contact plugs 120 to couple to the printed circuit board 300. In various embodiments, other types of mounting may be used.

Further, in various embodiments, additional structures may be attached to the semiconductor packages. For example, FIG. 17B illustrates a heat sink 350 disposed over the semiconductor package. The heat sink 350 may be coupled using a thin adhesive 330, which may be thermally conductive allowing heat conduction away from the semiconductor chip 20.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1, FIG. 2, FIGS. 3-13, FIGS. 14-16, and FIG. 17 may be combined with each other. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor package, the method comprising:
    placing a plurality of semiconductor chips over a carrier, each of the plurality of semiconductor chips having a first side contact region on a first side and an opposite second side, each of the plurality of semiconductor chips having an active region adjacent the first side, wherein the second side faces the carrier;
    forming a reconstituted wafer by applying an encapsulant at the plurality of semiconductor chips and the carrier;
    forming a through opening and a first contact opening in the encapsulant using a common process step;
    from the first side, forming a first contact via and a second contact via by filling the through opening and the first contact opening with a conductive fill material, wherein upper portions of the first contact via and the second contact via form contact pads for connecting each of the plurality of semiconductor chips to external nodes;
    separating the reconstituted wafer from the carrier;
    thinning the first contact via and the reconstituted wafer so as to thin the plurality of semiconductor chips from the second side; and
    after the thinning, forming a second side conductive plate under a second side contact region from the second side, wherein the second side contact region is coupled to the first contact via through the second side conductive plate; and
    forming individual packages by singulating the reconstituted wafer, wherein the plurality of semiconductor chips comprise chips configured to regulate current flow in a direction from the first side towards the second side.

2. The method of claim 1, wherein placing a plurality of semiconductor chips over a carrier comprises placing a plurality of power chips and a plurality of devices, wherein each of the individual packages comprises a power chip of the plurality of power chips and a device of the plurality of devices.

3. The method of claim 2, wherein the plurality of devices comprises a horizontal semiconductor device configured to regulate current flow laterally in a plane along the first side.

4. The method of claim 1, wherein forming the through opening comprises using a laser drilling process.

5. The method of claim 1, wherein forming the first contact via and the second contact via comprises using an electrochemical deposition process.

6. The method of claim 1, wherein each of the plurality of semiconductor chips is configured to regulate current flow from the first side contact region to the second side contact region.

7. The method of claim 1, wherein each of the plurality of semiconductor chips comprises a power field effect transistor, and wherein the first side contact region is a source region of the power field effect transistor and the second side contact region is a drain region of the power field effect transistor.

8. The method of claim 7, further comprising:
forming a second contact opening in the encapsulant; and
forming a third contact via for a gate region of the power field effect transistor by filling the second contact opening with the conductive fill material.

9. The method of claim 1, wherein forming the second side conductive plate comprises depositing a structured second side conductive plate using an electrochemical deposition process.

10. The method of claim 1, wherein forming the second side conductive plate comprises depositing an unstructured second side conductive plate and structuring the unstructured second side conductive plate.

11. The method of claim 1, wherein thinning the plurality of semiconductor chips comprises thinning a workpiece comprising a heteroepitaxial layer over a silicon substrate, and wherein the thinning removes the silicon substrate.

12. The method of claim 1, wherein each of the plurality of semiconductor chips comprises an n-channel metal insulation semiconductor field effect transistor or a p-channel metal insulation semiconductor field effect transistor.

13. The method of claim 1, wherein the semiconductor package has less than ten terminals.

14. A method of forming a semiconductor package, the method comprising:
placing a plurality of power semiconductor chips over a carrier, each of the plurality of power semiconductor chips having a source contact region and a gate contact region on a first side and an opposite second side, each of the plurality of power semiconductor chips having an active region adjacent the first side, wherein the plurality of power semiconductor chips comprise chips configured to regulate vertical current flow in a direction from the first side towards the second side;
forming a reconstituted wafer by applying an encapsulant over the plurality of power semiconductor chips and the carrier;
forming a through opening in the encapsulant;
forming a first contact opening in the encapsulant over the source contact region and a second contact opening in the encapsulant over the gate contact region;
forming a first contact via by filling the through opening with a conductive fill material from the first side, wherein an upper portion of the first contact via forms a contact pad;
forming a second contact via and a third contact via by filling the first and the second contact openings with the conductive fill material;
thinning the first contact via and the plurality of power semiconductor chips by grinding the reconstituted wafer; and
after the thinning, forming a second side conductive plate under a drain contact region from the second side, wherein the drain contact region is coupled to the first contact via through the second side conductive plate wherein the second side conductive plate is formed from the second side opposite to the first side used to fill the through opening with the conductive fill material.

15. The method of claim 14, further comprising forming individual packages by singulating the reconstituted wafer.

16. The method of claim 14, wherein forming the through opening comprises using a laser drilling process.

17. The method of claim 14, wherein the through opening and the first contact opening are formed using a common process.

18. The method of claim 14, further comprising after forming the first, second, and the third contact vias, separating the reconstituted wafer from the carrier.

19. The method of claim 14, wherein forming the second side conductive plate comprises depositing a structured second side conductive plate using an electrochemical deposition process.

20. The method of claim 14, wherein forming the second side conductive plate comprises depositing an unstructured second side conductive plate and structuring the unstructured second side conductive plate.

* * * * *